US006844138B2

(12) United States Patent
Kita et al.

(10) Patent No.: US 6,844,138 B2
(45) Date of Patent: Jan. 18, 2005

(54) PROCESSES FOR PRODUCING LITHOGRAPHIC PRINTING PLATE

(75) Inventors: Nobuyuki Kita, Shizuoka (JP); Kazuyoshi Takii, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 120 days.

(21) Appl. No.: 10/052,355

(22) Filed: Jan. 23, 2002

(65) Prior Publication Data

US 2002/0142250 A1 Oct. 3, 2002

(30) Foreign Application Priority Data

Jan. 24, 2001 (JP) ....................................... 2001-015911

(51) Int. Cl.[7] .............................. G03F 7/26; G03F 7/30

(52) U.S. Cl. .................... 430/302; 430/138; 430/270.1; 430/271.1; 430/272.1; 430/273.1; 430/275.1; 430/309; 430/494; 430/944; 430/945; 101/453; 101/463.1

(58) Field of Search ............................. 430/272.1, 309, 430/138, 270.1, 271.1, 273.1, 275.1, 278.1, 302, 303, 348, 494, 944, 945; 101/453, 454, 463.1

(56) References Cited

U.S. PATENT DOCUMENTS

| | | | | | |
|---|---|---|---|---|---|
| 6,068,965 | A | * | 5/2000 | Hauquier et al. | 430/302 |
| 6,090,524 | A | * | 7/2000 | Deboer et al. | 430/272.1 |
| 6,357,353 | B1 | * | 3/2002 | Vermeersch et al. | 101/466 |
| 6,387,595 | B1 | * | 5/2002 | Teng | 430/302 |
| 6,397,749 | B1 | * | 6/2002 | Kita et al. | 101/457 |
| 6,468,717 | B2 | * | 10/2002 | Kita et al. | 430/278.1 |
| 6,593,057 | B2 | * | 7/2003 | Kita | 430/270.1 |
| 2001/0008740 | A1 | * | 7/2001 | Kita | 430/270.1 |

* cited by examiner

*Primary Examiner*—Barbara L. Gilliam
(74) *Attorney, Agent, or Firm*—Burns, Doane, Swecker & Mathis, L.L.P.

(57) ABSTRACT

A process for producing a lithographic printing plate by on-press developing a heat-sensitive lithographic printing plate precursor having on a metallic base in this order (1) an ink-receptive layer, (2) a hydrophilic layer containing colloidal particles of an oxide or hydroxide of at least one element, e.g., silicon or aluminum, and (3) a hydrophilic overcoat layer capable of being removed on a printing machine, which includes: rotating a plate cylinder having attached thereto the heat-sensitive lithographic printing plate precursor which has been exposed; subsequently supplying an ink and a dampening water to the plate surface by simultaneously bringing a dampening roll and an inking roll into contact with the plate surface or by bringing a water-metering roll into contact with an inking roll and then bringing the inking roll, which functions also to dampen, into contact with the plate surface; and thereby removing the overcoat layer and the exposed parts of the hydrophilic layer.

2 Claims, No Drawings

PROCESSES FOR PRODUCING LITHOGRAPHIC PRINTING PLATE

FIELD OF THE INVENTION

The present invention relates to a process for producing a lithographic printing plate from a heat-sensitive lithographic printing plate precursor. More particularly, the present invention relates to a process for producing a lithographic printing plate having satisfactory suitability for printing by subjecting a heat-sensitive lithographic printing plate precursor to scanning exposure to a near-infrared or infrared laser beam based on digital signals to thereby record an image thereon and then developing the plate precursor on a printing machine (i.e., a printing press).

BACKGROUND OF THE INVENTION

Many investigations have been made on computer-to-plate (CTP) systems in which a printing plate is produced through laser beam scanning exposure based on digital signals. Among these, investigations on a lithographic printing plate precursor which does not necessitate development and can be attached, without any treatment after exposure, to a printing machine (i.e., a printing press) and used for printing have been made. This type of plate precursor is intended to attain further rationalization of platemaking and to mitigate problems concerning waste liquid treatment. For example, various techniques concerning CTP printing plates necessitating no development are described in *Nihon Insatsu Gakkai-shi*, Vol.36, pp.148–163 (1999).

One promising technique is a method utilizing ablation which comprises exposing a printing plate precursor with a solid high-power infrared laser, such as a semiconductor laser or YAG laser, to heat the exposed areas by the action of a light-to-heat converting agent (i.e., a compound capable of converting light into heat) which converts light into heat and to thereby cause those areas to decompose and evaporate.

Namely, the technique described above comprises forming a hydrophilic layer on a base (i.e., a substrate) having an oleophilic ink-receptive surface or ink-receptive layer and removing the hydrophilic layer by ablation.

In WO 94/18005 is described a printing plate produced by forming a crosslinked hydrophilic layer on an oleophilic laser light-absorbing layer and ablating the hydrophilic layer. This hydrophilic layer comprises poly(vinyl alcohol) crosslinked with a hydrolyzate of tetraethoxysilicon and containing titanium dioxide particles, and is intended to have improved film strength. Although this technique has brought about improved press life, it is insufficient in the property of not causing staining and a further improvement has been required.

In WO 98/40212 and WO 99/19143 is described a lithographic printing plate precursor which comprises a base, an ink-receptive layer formed thereon, and a hydrophilic layer formed thereon comprising as the main component a colloidal oxide, such as silica, crosslinked with a crosslinking agent such as aminopropyltriethoxysilane and which can be attached to a printing machine (i.e., a printing press) without undergoing development. This hydrophilic layer is intended to have a minimal amount of hydrocarbon groups for enhancing the property of not causing staining and to have improved press life due to the crosslinking of a colloid with a crosslinking agent. However, the impression capability of this printing plate is several thousand impressions, which has been still insufficient.

The heat-sensitive lithographic printing plate precursor utilizing ablation has the problem that it does not provide both of improved printing durability (i.e., press life) and property of not causing staining. In addition, this printing plate precursor has had the following drawbacks. Since ablation debris fly off to stain the laser-exposing apparatus and optical system, it is necessary to provide these apparatus with an ablation debris trapping apparatus. Furthermore, even with the trapping apparatus, it is difficult to sufficiently eliminate the staining.

As a result of extensive investigations, it was found that a heat-sensitive lithographic printing plate precursor which gives a plating plate having excellent printing durability and causing no staining and is inhibited from causing ablation debris flying is obtained by forming a hydrophilic layer containing a colloid of an oxide or hydroxide of at least one element selected from the group consisting of beryllium, magnesium, aluminum, silicon, titanium, boron, germanium, tin, zirconium, iron, vanadium, antimony, and the transition metals and a water-soluble overcoat layer on a base having an ink-receptive surface or coated with an ink-receptive layer (see Japanese Patent Application (Laid-Open) No. 96936/2001).

However, this heat-sensitive lithographic printing plate precursor still has a problem that the printing plate has insufficient ink receptivity in the beginning of printing and necessitates a large amount of spoilage before complete ink reception.

SUMMARY OF THE INVENTION

Accordingly, an object of the present invention is to eliminate the new problem described above. Namely, the object of the present invention is to improve initial ink receptivity in the case where a printing plate precursor is exposed and then directly attached, without undergoing any treatment, to a printing machine to conduct printing.

The present invention is as follows:

1. A process for producing a lithographic printing plate which comprises: imagewise exposing with a high-power near-infrared or infrared laser a heat-sensitive lithographic printing plate precursor which comprises a metallic base having thereon in this order, (1) an ink-receptive layer, (2) a hydrophilic layer containing colloidal particles of an oxide or hydroxide of at least one element selected from the group consisting of beryllium, magnesium, aluminum, silicon, titanium, boron, germanium, tin, zirconium, iron, vanadium, antimony, and the transition metals, and (3) a hydrophilic overcoat layer capable of being removed on a printing machine and which contains a compound capable of converting light into heat in at least one of the ink-receptive layer, the hydrophilic layer, and the hydrophilic overcoat layer; attaching the printing plate precursor to the plate cylinder of a printing machine without subjecting the plate precursor to any treatment; rotating the plate cylinder; subsequently supplying an ink and a dampening water to the plate surface by simultaneously bringing a dampening roll and an inking roll into contact with the plate surface or by bringing a water-metering roll into contact with an inking roll and then bringing the inking roll, which functions also to dampen, into contact with the plate surface; and thereby removing the overcoat layer and those parts of the hydrophilic layer which have been exposed.
2. A process for producing a lithographic printing plate on a printing machine which comprises: attaching the heat-sensitive lithographic printing plate precursor described in 1 above to the plate cylinder of a printing machine equipped with the laser-exposing apparatus; imagewise exposing the printing plate precursor with a near-infrared or infrared laser from the laser-exposing apparatus mounted on the printing machine, while rotating the plate cylinder; subsequently supplying an ink and a dampening water to the plate surface after completion of the imagewise exposure, without stopping the rotation of the plate cylinder, by simultaneously bringing a dampening roll and an inking roll into contact with the plate surface or by bringing a water-metering roll into contact with an inking roll and then bringing the inking roll, which functions also to dampen, into contact with the plate surface; and thereby removing the overcoat layer and those parts of the hydrophilic layer which have been exposed.

In the case of using an ablation type heat-sensitive lithographic printing plate precursor having a hydrophilic overcoat layer, it is necessary to remove, after exposure, the overcoat layer and the exposed parts of the hydrophilic layer on a printing machine with the on-press development. The present inventor presumed that the reason why the printing plate obtained from this type of lithographic printing plate precursor had poor initial ink receptivity was that hydrophilic ingredients contained in the overcoat layer and hydrophilic layer were remained in the ink-receiving areas. The inventor made investigations so as to develop a method for efficiently removing these hydrophilic ingredients in a short time period in a printing operation.

Japanese Patent Application (Laid-Open) No. 123387/1997 discloses a technique concerning the on-press development of a phase change type heat-sensitive lithographic printing plate precursor having an image-forming layer comprising a hydrophilic binder and hydrophobic thermoplastic polymer particles dispersed therein. With respect to the order of supply of a dampening water and an ink, there is a description therein to the effect that although a dampening water is generally supplied first, it may be supplied simultaneously with or after an ink. However, results of an investigation did not agree with this description. Namely, it was found that in the case of an ablation type heat-sensitive lithographic printing plate precursor as in the present invention, the timings of dampening water supply and ink supply greatly influence the removability of hydrophilic ingredients. It was further found that simultaneous supply of a dampening water and an ink is most effective in removing hydrophilic ingredients and can greatly improve initial ink receptivity. The present invention has been achieved based on this finding.

DETAIELD DESCRIPTION OF THE INVENTION

Embodiments of the present invention will be explained below in detail.

Examples of the metallic base (i.e., the metal substrate) which are suitable for use in the present invention include sheets (or plates) of aluminum, zinc, copper, nickel, and stainless steel. Especially preferred of these is an aluminum base (i.e., an aluminum substrate).

As a raw aluminum sheet for the aluminum base, sheets of well-known aluminum materials in general use can be suitably used. Namely, the raw aluminum sheet may be a sheet of pure aluminum or a sheet of an alloy of aluminum as the main component with a slight amount of one or more foreign elements. Examples of the foreign elements which may be contained in the aluminum alloy include silicon, iron, manganese, copper, magnesium, chromium, zinc, bismuth, nickel, and titanium. The content of such foreign elements in the alloy is up to 10% by weight. The raw sheet may be either an aluminum sheet formed from an aluminum ingot produced by a DC casting method or an aluminum sheet formed from an aluminum ingot produced by a continuous casting method.

The thickness of the aluminum base to be used in the present invention is generally from 0.05 to 0.6 mm, preferably from 0.1 to 0.4 mm, more preferably from 0.15 to 0.3 mm.

Before being used, the aluminum sheet is preferably subjected to surface treatments such as surface roughening and anodization. Such surface treatments facilitate adhesion of an ink-receptive layer to the aluminum sheet.

For roughening a surface of the aluminum sheet, various techniques may be used. For example, a method of mechanically roughening the surface, a method in which a surface layer is electrochemically dissolved away to roughen the surface, a method in which a surface layer is chemically dissolved away selectively, or a combination of two or more of these methods are exemplified. In the mechanical method, well-known techniques can be used, such as ball abrading, brush abrading, blast abrading, and buff abrading. Suitable as the chemical method is to immerse in a saturated aqueous solution of an aluminum salt of a mineral acid, such as that described in Japanese Patent Application (Laid-Open) No. 31187/1979. Examples of the electrochemical surface-roughening method include a method in which AC or DC electrolysis is conducted in an electrolytic solution containing an acid such as hydrochloric acid or nitric acid. Also usable is an electrolytic surface-roughening method using a mixed acid, as disclosed in Japanese Patent Application (Laid-Open) No. 63902/1979.

The aluminum sheet which has undergone surface roughening is, according to need, alkali-etched with an aqueous solution of potassium hydroxide or sodium hydroxide and then neutralized, before being subjected to an anodization treatment.

For the anodization treatment of the aluminum sheet can be used various electrolytes which form a porous oxide film. Generally used is sulfuric acid, phosphoric acid, oxalic acid, chromic acid, a sulfamic acid, benzenesulfonic acid, or a mixture of two or more of these acids. The concentration of such an electrolyte is suitably determined according to the kind of the electrolyte.

Conditions for the anodization treatment cannot be unconditionally specified because they vary considerably depending on the electrolyte to be used. In general, however, appropriate conditions include an electrolyte concentration in solution of from 1 to 80% by weight, an electrolytic solution temperature of from 5 to 70° C., a current density of from 5 to 60 $A/dm^2$, a voltage of from 1 to 100 V, and an electrolysis period of from 10 seconds to 50 minutes.

Especially preferred of such anodization treatments are the method of anodization in sulfuric acid at a high current density as described in British Patent 1,412,768 and the method of anodization with an electrolytic bath containing phosphoric acid as described in U.S. Pat. No. 3,511,661.

The amount of the oxide film thus formed on the aluminum substrate for use in the present invention is preferably 2.0 $g/m^2$ or larger, more preferably from 2.0 to 6.0 $g/m^2$, most preferably from 2.0 to 4.0 $g/m^2$.

The substrate which has undergone the surface treatments described above and has a coating film formed by anodization may be used, without any further treatment, as the base in the present invention. However, for the purpose of further improving adhesion to an upper layer, heat resistance, or other properties, the substrate may be subjected, according to need, to one or more treatments suitably selected, for example, from that treatment for enlarging or filling micropores present in the coating film formed by anodization (i.e., the anodic oxidation layer) which is described in Japanese Patent Applications (Laid-Open) Nos. 2001-253181 and 2001-322365, and from a surface-hydrophilizing treatment in which the substrate is immersed in an aqueous solution containing a hydrophilic compound.

Preferred examples of the hydrophilic compound for use in the hydrophilizing treatment include polyvinylphosphonic acids, compounds having a sulfo group, saccharide compounds, citric acid, alkali metal silicates, zirconium potassium fluoride, and phosphoric acid salt/inorganic fluorine compound.

The surface roughness of the aluminum base thus obtained is preferably 0.48 $\mu$m or higher, more preferably 0.5 $\mu$m or higher, in terms of center-line average surface roughness Ra (as defined in JIS B 0601). Although the upper limit of Ra is difficult to fix unconditionally, it is generally preferably about 0.7 $\mu$m.

The ink-receptive layer for use in the present invention comprises an organic polymer. As the organic polymer, is used one which is soluble in solvents and is capable of forming an oleophilic film. Desirable organic polymers are ones which are insoluble in the solvent to be used for forming a hydrophilic layer (which is an upper layer) thereon by coating. In some cases, however, it is desirable to use an organic polymer which partly swells with the solvent to be used for forming the upper layer by coating, because it may have excellent adhesion to the hydrophilic layer. In case where an organic polymer soluble in the solvent to be used for forming the hydrophilic layer by coating is employed, it is desirable to cure the ink-receptive layer beforehand, for example, by adding a crosslinking agent.

Useful examples of the organic polymer include polyesters, polyurethanes, polyurea, polyimides, polysiloxanes, polycarbonates, phenoxy resins, epoxy resins, novolak resins, resol resins, phenol compound/acetone condensation resins, poly(vinyl acetate), acrylic resins and copolymers thereof, poly(vinylphenol), poly(vinylhalogenophenol)s, methacrylic resins and copolymers thereof, acrylamide copolymers, methacrylamide copolymers, poly(vinyl formal), polyamides, poly(vinyl butyral), polystyrene, cellulose ester resins, poly(vinyl chloride), and poly(vinylidene chloride).

More preferred of those organic polymers are resins having hydroxyl, carboxyl, sulfonamide, or trialkoxysilyl groups in side chains. Such resins show excellent adhesion to the base and to the upper hydrophilic layer and can be easily cured with a crosslinking agent when desired.

Other preferred examples include acrylonitrile copolymers, polyurethanes, and resins formed by photocuring a copolymer having sulfonamide groups or hydroxyl groups in side chains with a diazo resin.

Examples of the epoxy resins suitable for use in the ink-receptive layer in the present invention include bisphenol A/epichlorohydrin polyaddition products, bisphenol F/epichlorohydrin polyaddition products, halogenated-bisphenol A/epichlorohydrin polyaddition products, biphenyl type bisphenol/epichlorohydrin polyaddition products, and novolak resin/epichlorohydrin polyaddition products. Specific examples thereof include Epikote 1007 (softening point, 128° C.; $M_n$, about 2,900; epoxy equivalent, 2,000), Epikote 1009 (softening point, 144° C.; $M_n$, about 3,750; epoxy equivalent, 3,000), Epikote 1010 (softening point, 169° C.; $M_n$, about 5,500; epoxy equivalent, 4,000), Epikote 1100L (softening point, 149° C.; epoxy equivalent, 4,000), and Epikote YX31575 (softening point, 130° C.; epoxy equivalent, 1,200), all manufactured by Yuka Shell Epoxy Co., Ltd.

Examples of the novolak resins and resol resins include products of the addition condensation of phenol, cresol (m-cresol, p-cresol, or a mixture of m- and p-cresols), phenol/cresol (m-cresol, p-cresol, or a mixture of m- and p-cresols), phenol-modifiedxylene, t-butylphenol, octylphenol, resorcinol, pyrogallol, catechol, chlorophenol (m- or p-chlorophenol), bromophenol (m- or p-bromophenol), salicylic acid, or phloroglucinol with an aldehyde such as, e.g., formaldehyde or paraformaldehyde.

Other preferred examples of the polymeric compound include copolymers which comprise structural units derived from monomers selected from the following monomers (1) to (12) and generally have an average molecular weight of from 10,000 to 200,000.

(1) Acrylamides, methacrylamides, acrylic esters, and methacrylic esters each having an aromatic hydroxy group and hydroxystyrenes, such as, N-(4-hydroxyphenyl) acrylamide, N-(4-hydroxyphenyl)methacrylamide, o-, m-, and p-hydroxystyrenes, and o-, m-, and p-hydroxyphenyl acrylates or methacrylates;

(2) acrylic esters and methacrylic esters each having an aliphatic hydroxy group, such as, 2-hydroxyethyl acrylate and 2-hydroxyethyl methacrylate;

(3) acrylic esters such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, and N,N-dimethylaminoethyl acrylate;

(4) methacrylic esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, and N,N-dimethylaminoethyl methacrylate;

(5) acrylamides and methacrylamides, such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, and N-ethyl-N-phenylmethacrylamide;

(6) vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether;

(7) vinyl esters such as vinyl acetate, vinyl chloroacetate, vinyl butyrate, and vinyl benzoate;

(8) styrenes, such as styrene, methylstyrene and chloromethylstyrene;

(9) vinyl ketones such as methyl vinyl ketone, ethyl vinyl ketone, propyl vinyl ketone, and phenyl vinyl ketone;

(10) olefins such as ethylene, propylene, isobutylene, butadiene, and isoprene;

(11) N-vinylpyrrolidone, N-vinylcarbazole, 4-vinylpyridine, acrylonitrile, methacrylonitrile, and the like; and

(12) acrylamides or methacrylamides containing a sulfonamide group, such as

N-(o-aminosulfonylphenyl)acrylamide,
N-(m-aminosulfonylphenyl)acrylamide,
N-(p-aminosulfonylphenyl)acrylamide,
N-[1-(3-aminosulfonyl)naphthyl]acrylamide,
N-(2-aminosulfonylethyl)acrylamide,
N-(o-aminosulfonylphenyl)methacrylamide,
N-(m-aminosulfonylphenyl)methacrylamide,
N-(p-aminosulfonylphenyl)methacrylamide,
N-[l-(3-aminosulfonyl)naphthyl]methacrylamide, and
N-(2-aminosulfonylethyl)methacrylamide, and acrylic or methacrylic esters containing a sulfonamide group, such as o-aminosulfonylphenyl acrylate, m-aminosulfonylphenyl acrylate, p-aminosulfonylphenyl acrylate,
1-(3-aminosulfonylphenylnaphthyl) acrylate,
o-aminosulfonylphenyl methacrylate, m-aminosulfonylphenyl methacrylate, p-aminosulfonylphenyl methacrylate, and
1-(3-aminosulfonylphenylnaphthyl) methacrylate.

One or more of those organic polymers are dissolved in an appropriate solvent and the solution is applied to the base and dried. Thus, an ink-receptive layer can be formed on the base. Although the organic polymers only maybe dissolved in a solvent, other ingredients may be added according to need, such as a crosslinking agent, adhesion aid, colorant, coating surface improver, and plasticizer.

Furthermore, an additive which is colored or decolored by heating may be added in order to form a printout image after exposure.

Examples of the crosslinking agent for crosslinking the organic polymer include diazo resins, aromatic diazide compounds, epoxy resins, isocyanate compounds, blocked isocyanate compounds, products of initial hydrolysis and condensation of a tetraalkoxysilicon, glyoxal, aldehyde compounds, and methylol compounds.

Examples of the adhesion aid include diazo resins, which bring about excellent adhesion to the base and the hydrophilic layer. Other useful examples thereof include silane coupling agents, isocyanate compounds, and titanium compound coupling agents.

As the colorants may be used ordinary dyes and pigments. Especially preferred examples thereof include Rhodamine 6G chloride, Rhodamine B chloride, Crystal Violet, Malachite Green oxalate, quinizarin, and 2-(α-naphthyl)-5-phenyloxazole. Other examples of the dyes include triphenylmethane, diphenylmethane, oxazine, xanthene, iminonaphthoquinone, azomethine, and anthraquinone type dyes represented by Oil Yellow #101, Oil Yellow #103, Oil Pink #312, Oil Green BG, Oil Blue BOS, Oil Blue #603, Oil Black BY, Oil Black BS, and Oil Black T-505 (manufactured by Orient Chemical Industries Ltd.), Victoria Pure Blue, Crystal Violet (CI 42555), Methyl Violet (CI 42535), Ethyl Violet, Methylene Blue (CI 52015), and Patent Pure Blue (manufactured by Sumitomo Mikuni Kagaku K.K.), Brilliant Blue, Methyl Green, Erythricin B, basic fuchsine, m-cresol purple, Auramine, 4-p-diethylaminophenyliminonaphthoquinone, and cyano-p-diethylaminophenylacetanilide. Examples thereof further include the dyes described in Japanese Patent Application (Laid-Open) Nos. 293247/1987 and 179290/1997.

In the case of incorporating any of those colorants into the ink-receptive layer, the content thereof in the ink-receptive layer is generally about from 0.02 to 10% by weight, preferably about from 0.1 to 5% by weight, based on all solid components of the layer.

A fluorochemical surfactant or silicone surfactant, which are well known as coating surface improvers, can be used. Specifically, surfactants having a perfluoroalkyl group or dimethylsiloxane group are useful in conditioning the coating surface.

A plasticizer may be added according to need to the ink-receptive layer in the present invention in order to impart flexibility or other properties to the coating film. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic or methacrylic acid.

Examples of the additive which is colored or decolored and can be added to the ink-receptive layer in the present invention include combinations of a heat-acid generator such as a diazo compound or a diphenyliodonium salt with a leuco dye (e.g., leuco-Malachite Green, leuco-Crystal Violet, or Crystal Violet lactone) or with a pH-sensitive color-changing dye (e. g., Ethyl Violet or Victoria Pure Blue BOH). Also useful is a combination of an acid-color-forming dye with an acid binder, such as that described in EP 897134. In this system, the bonds forming an association-state dye are cleaved by heating and the colored state becomes colorless with the formation of a lactone.

Those additives may be added in an amount of preferably up to 10% by weight, more preferably up to 5% by weight, based on the solid components of the ink-receptive layer.

Examples of the solvent to be used for forming the ink-receptive layer through coating include alcohols (e.g., methanol, ethanol, propyl alcohol, ethylene glycol, diethylene glycol, propylene glycol, dipropylene, glycol, ethylene glycol monomethyl ether, propylene glycol monomethyl ether, and ethylene glycolmonoethyl ether), ethers (e.g., tetrahydrofuran, ethylene glycol dimethyl ether, propylene glycol dimethyl ether, and tetrahydropyran), ketones (e.g., acetone, methyl ethyl ketone, and acetylacetone), esters (e.g., methyl acetate, ethyl acetate, ethylene glycol monomethyl ether monoacetate, γ-butyrolactone, methyl lactate, and ethyl lactate), and amides (e.g., formamide, N-methylformamide, pyrrolidone, and N-methylpyrrolidone). These solvents may be used alone or as a mixture of two or more thereof. The concentration of the ingredients for forming the ink-receptive layer (all solid components including the additives) in the coating fluid is preferably from 1 to 50% by weight. Besides being formed from a solution in an organic solvent such as those described above, a coating film can be formed from an aqueous emulsion. In this case, the concentration of the ingredients for forming the ink-receptive layer is preferably from 5 to 50% by weight.

The amount of the ink-receptive layer in the present invention is preferably from 0.25 to 0.7 $g/m^2$, more preferably from 0.35 to 0.5 $g/m^2$, on a dry basis.

The hydrophilic layer in the present invention contains colloidal particles of an oxide or hydroxide of at least one element selected from the group consisting of beryllium, magnesium, aluminum, silicon, titanium, boron, germanium, tin, zirconium, iron, vanadium, antimony, and the transition metals.

Colloidal particles of an oxide or hydroxide of at least one of those elements can be obtained as the dispersed phase, i.e., colloidal particles, of a colloidal dispersion by various known methods such as, e.g., the hydrolysis of a halide or alkoxy compound of the element and the condensation of a hydroxide of the element. In the case where the colloidal particles are added to a coating fluid for forming the hydrophilic layer, they can be added in the form of a colloidal dispersion.

Especially preferred of the oxides or hydroxides of those elements is an oxide or hydroxide of at least one element selected from aluminum, silicon, titanium, and zirconium.

When the colloidal particles of an oxide or hydroxide of at least one of those elements are silica particles, they are preferably spherical particles having a particle diameter of from 5 to 100 nm. Colloidal particles in the form of pearl necklaces each made up of spherical particles of from 10 to 50 nm linked to one another in a length of from 50 to 400 nm can be used. Also effective are feathery colloidal particles having an agglomerate size of, e.g., 100 nm×10 nm, such as colloidal particles of aluminum oxide or hydroxide.

Those colloidal dispersions are available as commercial products manufactured, e.g., by Nissan Chemical Industries, Ltd.

Besides water, useful examples of the dispersion medium for those colloidal particles include organic solvents such as methanol, ethanol, ethylene glycol monomethyl ether, and methyl ethyl ketone.

A hydrophilic resin can be used in the hydrophilic layer in the present invention together with the colloidal particles. Use of a hydrophilic resin can enhance the film strength of the hydrophilic layer and improve printing durability (i.e., press life).

Preferred examples of the hydrophilic resin include resins having hydrophilic groups such as hydroxyl, carboxyl, hydroxyethyl, hydroxypropyl, amino, aminoethyl, aminopropyl, and carboxymethyl.

Specific examples of the hydrophilic resin include gum arabic, casein, gelatin, starch derivatives, carboxymethyl cellulose and sodium salts thereof, cellulose acetate, sodium alginate, vinyl acetate/maleic acid copolymers, styrene/maleic acid copolymers, poly(acrylic acid) and salts thereof, poly(methacrylic acid) and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycol, poly(propylene oxide), polyvinyl alcohol), hydrolyzed poly(vinyl acetate) having a degree of hydrolysis of at least 60% by weight, preferably at least 80% by weight, poly (vinyl formal), poly(vinyl butyral), polyvinylpyrrolidone, homopolymers and copolymers of acrylamide, homopolymers and copolymers of methacrylamide, and homopolymers and copolymers of N-methylolacrylamide.

The amount of those hydrophilic resins to be added is preferably up to 40% by weight, more preferably up to 20% by weight, based on the solid components of the hydrophilic layer.

A resin having aromatic hydroxyl groups may be used in the hydrophilic layer in the present invention. Use of a resin having aromatic hydroxyl groups can improve not only the film strength of the hydrophilic layer but initial ink receptivity.

The resin having aromatic hydroxyl groups is preferably one which dissolves in methanol in an amount of at least 5% by weight at 25° C. Examples of this resin include alkali-soluble resins such as novolak resins, resol resins, polyvinylphenol resins, and ketone/pyrogallol resins.

Preferred examples of the novolak resins include novolak resins obtained by addition-condensing at least one hydroxyl-containing aromatic compound selected from phenol, o-cresol, m-cresol, p-cresol, 2,5-xylenol, 3,5-xylenol, and resorcinol with at least one aldehyde selected from formaldehyde, acetaldehyde, propionaldehyde, and the like in the presence of an acid catalyst. Paraformaldehyde and paraldehyde may be used in place of the formaldehyde and acetaldehyde, respectively.

Especially preferred of those novolak resins are products of the addition condensation of either an m-cresol/p-cresol/2,5-xylenol/3,5-xylenol/resorcinol mixture in a molar ratio of (40–100)/(0–50)/(0–20)/(0–20)/(0–20) or a phenol/m-cresol/p-cresol mixture in a molar ratio of (1–100)/(0–70)/(0–60) with an aldehyde. Especially preferred of the aldehydes is formaldehyde.

Such novolak resins for use in the hydrophilic layer have a weight-average molecular weight of preferably from 1,000 to 15,000, more preferably from 1,500 to 10,000.

Preferred examples of the resol resins include resol resins obtained by addition-condensing at least one member selected from hydroxyl-containing aromatic hydrocarbons such as phenol, m-cresol, o-cresol, p-cresol, 2,5-xylenol, 3,5-xylenol, resorcinol, pyrogallol, bis(4-hydroxyphenyl) methane, bisphenol A, o-ethylphenol, m-ethylphenol, p-ethylphenol, propylphenol, n-butylphenol, t-butylphenol, 1-naphthol, and 2-naphthol and other polynuclear aromatic hydrocarbons having two or more hydroxyl groups with at least one aldehyde or ketone selected from aldehydes such as formaldehyde, acetaldehyde, propionaldehyde, benzaldehyde, and furfural and ketones such as acetone, methyl ethyl ketone, and methyl isobutyl ketone in the presence of an alkaline catalyst.

Paraformaldehyde and paraldehyde may be used in place of the formaldehyde and acetaldehyde, respectively. Such resol resins have a weight-average molecular weight of preferably from 500 to 10,000, more preferably from 1,000 to 5,000.

Preferred examples of the polyvinylphenol resins include homopolymers of hydroxystyrenes and hydroxystyrene derivatives, such as o-hydroxystyrene, m-hydroxystyrene, p-hydroxystyrene, 2-(o-hydroxyphenyl)propylene, 2-(m-hydroxyphenyl)propylene, and 2-(p-hydroxyphenyl) propylene, and copolymers of two or more of these monomers. Such hydroxystyrene compounds may have, on the aromatic ring, one or more substituents selected from halogens such as chlorine, bromine, iodine, and fluorine and alkyl groups having 1 to 4 carbon atoms. Consequently, examples of the polyvinylphenol resins include polyvinylphenols in which the aromatic rings may have a halogen or an alkyl group having 1 to 4 carbon atoms.

Other useful examples of the polyvinylphenol resins include copolymers of a hydroxystyrene compound, such as o-hydroxystyrene, m-hydroxystyrene, p-hydroxystyrene, 2-(o-hydroxyphenyl)propylene, 2-(m-hydroxyphenyl) propylene, or 2-(p-hydroxyphenyl)propylene, with methacrylic acid, acrylic acid, an alkyl methacrylate, or an alkyl acrylate.

In general, a polyvinylphenol resin is obtained by polymerizing one or more optionally substituted hydroxystyrenes in the presence of a radical polymerization initiator or cationic polymerization initiator. This polyvinylphenol resin may be one which has been partly hydrogenated, or may be one in which the hydroxyl groups have been partly protected by t-butoxycarbonyl, pyranyl, furanyl, or other groups. The polyvinylphenol resins have a weight-average molecular weight of preferably from 1,000 to 100,000, more preferably from 1,500 to 50,000.

Especially useful examples of the ketone/pyrogallol resins include acetone/pyrogallol resins.

The amount of those resins having aromatic hydroxyl groups to be added is preferably up to 20% by weight, more preferably up to 12% by weight, based on the solid components of the hydrophilic layer.

A crosslinking agent which accelerates the crosslinking of the colloidal oxide or hydroxide of at least one of the above-described elements may be added to the hydrophilic layer in the present invention besides the colloidal oxide or hydroxide and the resin having aromatic hydroxyl groups. Preferred examples of the crosslinking agent include products of the initial hydrolysis and condensation of a tetraalkoxysilane, trialkoxysilylpropyl-N,N,N-trialkylammonium halides, and aminopropyltrialkoxysilanes. The amount of the crosslinking agent to be added is preferably up to 5% by weight based on the solid components of the hydrophilic layer.

A crosslinking agent for the hydrophilic resin or for the resin having aromatic hydroxyl groups may also be added to the hydrophilic layer in the present invention for the purpose of enhancing printing durability. Examples of this crosslinking agent include formaldehyde, glyoxal, polyisocyanates, products of the initial hydrolysis and condensation of a tetraalkoxysilane, dimethylolurea, and hexamethylolmelamine.

Furthermore, an agent well known to function to improve the surface state of a coating may be added to the hydrophilic layer in the present invention. Examples thereof include fluorine-based surfactants, silicone-based surfactants, and polyoxyethylene-based surfactants.

The amount of the hydrophilic layer in the present invention is preferably from 0.2 to 0.8 $g/m^2$, more preferably from 0.3 to 0.5 $g/m^2$, on a dry basis.

A hydrophilic overcoat layer may be formed on the hydrophilic layer of the heat-sensitive lithographic printing plate precursor to be processed in the present invention, for the purposes of preventing the hydrophilic layer from being fouled by oleophilic substances or marred during storage or handling, preventing fingerprints from being left on the hydrophilic layer after handling with bare hands, and diminishing the generation of ablation debris.

The hydrophilic overcoat layer to be used in the present invention is a layer capable of being removed on a printing machine (i.e., a printing press). This layer comprises a water-soluble resin or a water-swellable resin formed by partly crosslinking a water-soluble resin.

The water-soluble resin to be used is selected from water-soluble, natural polymers and synthetic polymers. It has a film-forming ability when mixed with a crosslinking agent, applied, and dried.

Preferred examples of the water-soluble resin for use in the present invention include natural polymers such as gum arabic, water-soluble soybean polysaccharides, cellulose derivatives (e.g., carboxymethyl cellulose, carboxyethyl cellulose, and methyl cellulose),modifications of these, white dextrin, pullulan, and enzyme-decomposed etherified dextrins and synthetic polymers such as poly(vinyl alcohol) (produced by hydrolyzing poly (vinyl acetate) to a degree of hydrolysis of 65% or higher), poly(acrylic acid) and alkali metal salts or amine salt thereof, poly (acrylic acid) copolymers and alkali metal salts or amine salts thereof, poly (methacrylic acid) and alkali metal salts or amine salt thereof, vinyl alcohol/acrylic acid copolymers and alkali metal salts or amine salts thereof, polyacrylamide and copolymers thereof, poly(hydroxyethyl acrylate), polyvinylpyrrolidone and copolymers thereof, poly(vinyl methyl ether), vinyl methyl ether/maleic anhydride copolymers, poly (2-acrylamido-2-methyl-1-propanesulfonic acid) and alkali metal salts or amine salt thereof, and poly(2-acrylamido-2-methyl-1-propanesulfonic acid) copolymers and alkali metal salts or amine salts thereof.

A mixture of two or more of those resins may be used according to purposes. However, water-soluble resins which can be used in the present invention are not limited to those examples.

In the case where at least one water-soluble resin is partly crosslinked to form an overcoat layer on the hydrophilic layer, the crosslinking is accomplished by a crosslinking reaction of reactive functional groups possessed by the water-soluble resin. The crosslinking reaction may yield either covalent-bond crosslinks or ionic-bond crosslinks.

Through crosslinking, the overcoat layer comes to have reduced surface tackiness, resulting in improved handle ability. However, in case where the crosslinking proceeds excessively, the overcoat layer becomes oleophilic and difficult to remove on a printing machine. Consequently, moderate partial crosslinking is preferred.

A preferred degree of the partial crosslinking is such that when the resultant printing plate precursor is immersed in 25° C. water, the hydrophilic overcoat layer remains without elution for from 30 seconds to 10 minutes but the elution is confirmed when the immersion period exceeds 10 minutes.

Known polyfunctional compounds having a crosslinking ability may be used for the crosslinking reaction. Examples thereof include polyepoxy compounds, polyisocyanate compounds, polyalkoxysilyl compounds, salt compounds of polyvalent metals, polyamine compounds, aldehyde compounds, and hydrazine. A known catalyst can be used to accelerate the crosslinking reaction.

Specific examples of the known polyfunctional compounds having a crosslinking ability include the following compounds.

Examples of the polyepoxy compounds include glycerol polyglycidyl ethers, polyethylene glycol diglycidyl ether, polypropylene glycol diglycidyl ether, trimethylolpropane polyglycidyl ethers, sorbitol polyglycidyl ethers, and polycondensates of bisphenols or hydrogenated bisphenols with an epihalohydrin.

Examples of the polyamines include ethylenediamine, diethylenetriamine, triethylenetetramine, tetraethylenepentamine, hexamethylenediamine, propylenediamine, polyethyleneimine, and polyamideamines.

Examples of the polyisocyanate compounds include aromatic isocyanates such as tolylene diisocyanate, diphenylmethane diisocyanate, liquid diphenylmethane diisocyanate, polymethylene polyphenyl isocyanate, xylylene diisocyanate, naphthalene 1,5-diisocyanate, cyclohexane phenylene diisocyanate, and isopropylbenzene 2,4-diisocyanate, aliphatic isocyanates such as hexamethylene diisocyanate and decamethylene diisocyanate, alicyclic diisocyanates such as cyclohexyl diisocyanate and isophorone diisocyanate, and polypropylene glycol/tolylene diisocyanate adducts.

Examples of the silane compounds include methyltrimethoxysilane, methyltriethoxysilane, ethyltriethoxysilane, phenyltriethoxysilane, vinyltriethoxysilane, γ-aminopropyltriethoxysilane, N-(β-aminoethyl)-γ-aminopropyltrimethoxysilane, γ-glycidoxypropyltrimethoxysilane, γ-methacryloxypropyltrimethoxysilane, γ-mercaptopropyltrimethoxysilane, β-(3,4-epoxycyclohexyl)ethyltrimethoxysilane, dimethyldimethoxysilane, dimethyldiethoxysilane, diphenyldiethoxysilane, 3-chloropropylmethyldimethoxysilane, vinyltris (methyl ethyl ketoxime)silane, methyltris (methyl ethyl ketoxime) silane, and vinyltriacetoxysilane.

Examples of titanate compounds include tetraethyl orthosilicate, bis(dioctyl pyrophosphate) ethylene titanate, isopropyl trioctanoyl titanate, isopropyl dimethacryloyl isostearoyl titanate, isopropyl isostearoyl diacryloyl titanate, isopropyl (dioctyl phosphate) titanate, isopropyl tricumylphenyl titanate, isopropyl tri(N-aminoethylaminoethyl) titanate, dicumyl phenyloxyacetate titanate, diisostearoyl ethylene titanate, isopropyl tristearoyl titanate, isopropyl tridodecylbenzenesulfonyl titanate, isopropyl tris(dioctyl phosphate) titanate, tetraisopropyl bis (dioctyl phosphite) titanate, tetraoctyl bis(ditridecyl phosphite) titanate, tetra(2,2-diallyloxymethyl-1-butyl) bis (ditridecyl phosphite) titanate, and bis (dioctyl pyrophosphate) oxyacetate titanate.

Examples of the aldehyde compounds include formaldehyde, acetaldehyde, propyl aldehyde, butyl aldehyde, glyoxal, glutaraldehyde, and terephthalaldehyde.

Examples of the salt compounds of polyvalent metals include water-soluble salts of metals such as zinc, calcium, magnesium, barium, strontium, cobalt, manganese, and nickel.

Those crosslinking agents can be used alone or as a mixture of two or more thereof. Especially preferred of those crosslinking agents are water-soluble crosslinking agents. However, water-insoluble crosslinking agents can be used in the form of an aqueous dispersion prepared with the aid of a dispersant.

Especially preferred examples of water-soluble resin/crosslinking agent combinations include combinations of a water-soluble resin containing a carboxylic acid with a compound of a polyvalent metal, combinations of a water-soluble resin containing a carboxylic acid with a water-soluble epoxy resin, and combinations of a resin containing hydroxyl groups with a dialdehyde.

The preferred range of the amount of the crosslinking agent to be added is from 2 to 10% by weight based on the water-soluble resin. When a crosslinking agent is used in an amount within this range, excellent water resistance is obtained without impairing the removability of the overcoat layer on a printing machine.

A surfactant can be added to the overcoat layer for the purpose of securing evenness of coating. In the case of application as an aqueous solution, a nonionic surfactant is mainly used. Examples of the nonionic surfactant include sorbitan tristearate, sorbitan monopalmitate, sorbitan trioleate, stearic acid monoglyceride, polyoxyethylene nonylphenyl ether, and polyoxyethylene dodecyl ether.

The content of the nonionic surfactant in the overcoat layer is preferably from 0.05 to 5% by weight, more preferably from 1 to 3% by weight, based on all solid components of the layer.

The amount of the overcoat layer in the present invention is preferably from 0.1 to 4.0 $g/m^2$, more preferably from 0.15 to 0.25 $g/m^2$, on a dry basis.

When the overcoat layer is formed in an amount within that range, it is possible to satisfactorily prevent staining, scratching, fingerprint adhesion, and ablation debris generation without impairing the removability of the overcoat layer on a printing machine.

At least one of the ink-receptive layer, hydrophilic layer, and overcoat layer in the present invention contains a light-to-heat converting agent which functions to convert light into heat, so as to enhance sensitivity.

The light-to-heat converting agent is not particularly limited as long as it is a substance which absorbs a light having a wavelength of 700 nm or longer. Various pigments and dyes can be used. As the pigments can be used commercial pigments and pigments described in a Color Index (C.I.) handbook, *Saishin Ganryô Binran* (edited by Japan Society of Pigment Technology, published in 1977), *Saishin Ganryô Ôyô Gijutsu* (CMC Shuppan, published in 1986), and *Insatsu Inki Gijutsu* (CMC Shuppan, published in 1984).

Examples of the kinds of such pigments include black pigments, brown pigments, red pigments, purple pigments, blue pigments, green pigments, fluorescent pigments, metal powder pigments, and polymer-bonded pigments. Specific examples of usable pigments include insoluble azo pigments, azo lake pigments, condensation azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, fluorescent pigments, inorganic pigments, and carbon black.

Those pigments may be used without undergoing a surface treatment, or may be used after having undergone a surface treatment. Possible methods for surface treatment include a technique in which the surface of a pigment is coated with a hydrophilic resin or oleophilic resin, a technique in which a surfactant is adhered to the surface of a pigment, and a technique in which a reactive substance (e.g., a silica sol, alumina sol, silane coupling agent, epoxy compound, or isocyanate compound) is bonded to the surface of a pigment. These methods for surface treatment are described in *Kinzoku Sekken No Seishitsu To Ôyô* (Saiwai Shobo), *Insatsu Inki Gijutsu* (CMC Shuppan, published in 1984), and *Saishin Ganryô Ôyô Gijutsu* (CMC Shuppan, published in 1986). Of these pigments, those which absorb infrared ray are preferred because of their suitability for use with a laser which emits infrared ray. Carbon black is especially preferred as such an infrared-absorbing pigment.

A useful pigment to be added to the hydrophilic layer and overcoat layer in the present invention is carbon black whose surface has been coated with a hydrophilic resin or silica sol especially so as to be readily dispersible together with the water-soluble or hydrophilic resin and not to impair hydrophilicity.

The particle diameter of the pigment is in the range of preferably from 0.01 to 1 $\mu$m, more preferably from 0.01 to 0.5 $\mu$m. For dispersing the pigment, well-known dispersion techniques for the production of inks, toners, or the like can be used. Examples of usable dispersing machines include an ultrasonic disperser, sand mill, attritor, pearl mill, supermill, ball mill, impeller, disperser, KD mill, colloid mill, dynatron, three-roll mill, and pressure kneader. Details thereof are given in *Saishin Ganryô Ôyô Gijutsu* (CMC Shuppan, published in 1986).

As the dyes can be used commercial dyes and other known dyes shown in literature (e.g., *Senryô Binran*, edited by Japan Society of Organic Synthesis Chemistry, published in 1970; *Kagaku Kôgyô*, May 1986 issue, pp.45–51 "Near-Infrared-Absorbing Dyes"; and Kyûjû-Nendai Kinôsei Shikiso No Kaihatsu To Shijô Dôkô, Chapter 2, Section 2.3 (1990), CMC) and in patent documents. Examples of the dyes include infrared-absorbing dyes such as azo dyes, metal complex azo dyes, pyrazolone azo dyes, anthraquinone dyes, phthalocyanine dyes, carbonium dyes, qunoneimine dyes, polymethine dyes, and cyanine dyes.

Examples of the infrared-absorbing dyes further include the cyanine dyes described in Japanese Patent Application (Laid-Open) Nos. 125246/1983, 84356/1984, and 78787/

1985; the methine dyes described in Japanese Patent Application (Laid-Open) Nos. 173696/1983, 181690/1983, and 194595/1983; the naphthoquinone dyes described in Japanese Patent Application (Laid-Open) Nos. 112793/1983, 224793/1983, 48187/1984, 73996/1984, 52940/1985, and 63744/1985; the squarylium dyes described in Japanese Patent Application (Laid-Open) No. 112792/1983; the cyanine dyes described in British Patent 434,875, the dyes described in U.S. Pat. No. 4,756,933; the cyanine dyes described in U.S. Pat. No. 4,973,572; the dyes described in Japanese Patent Application (Laid-Open) No. 268512/1998; and the phthalocyanine compounds described in Japanese Patent Application (Laid-Open) No. 235883/1999.

Other preferred examples of the dyes include the near-infrared-absorbing sensitizer described in U.S. Pat. No. 5,156,938; the substituted arylbenzo(thio)pyrylium salts described in U.S. Patent 3,881,924; the trimethine thiapyrylium salts described in Japanese Patent Application (Laid-Open) No. 142645/1982 (U.S. Pat. No. 4,327,169); the pyrylium compounds described in Japanese Patent Application (Laid-Open) Nos. 181051/1983, 220143/1983, 41363/1984, 84248/1984, 84249/1984, 146063/1984, and 146061/1984; the cyanine dyes described in Japanese Patent Application (Laid-Open) No. 216146/1984; the pentamethine thiopyrylium salts described in U.S. Pat. No. 4,283,475; the pyrylium compounds disclosed in Japanese Patent Publication Nos. 13514/1993and 19702/1993; and Epolite III-178, Epolite III-130, and Epolite III-125, manufactured by Epoline Inc.

Of those dyes, water-soluble dyes are especially preferred dyes for use in the overcoat layer and hydrophilic layer. Specific examples of such water-soluble dyes are enumerated below in terms of structural formula.

(IR-1)

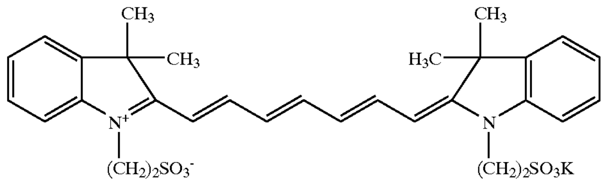

(IR-2)

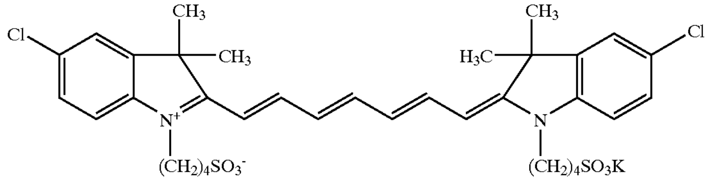

(IR-3)

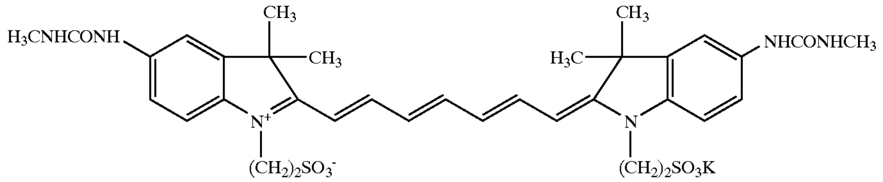

(IR-4)

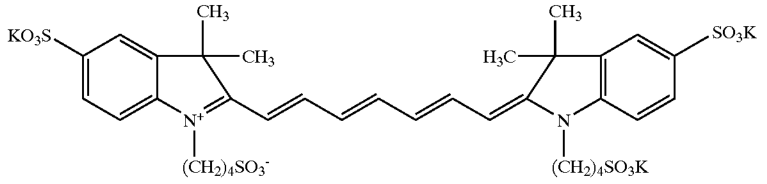

(IR-5)

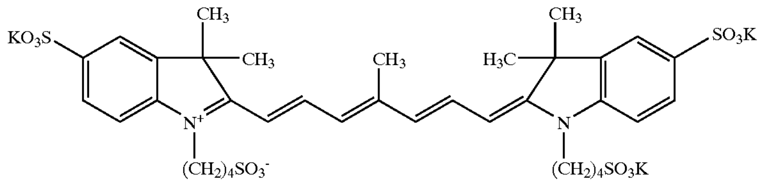

(IR-6)

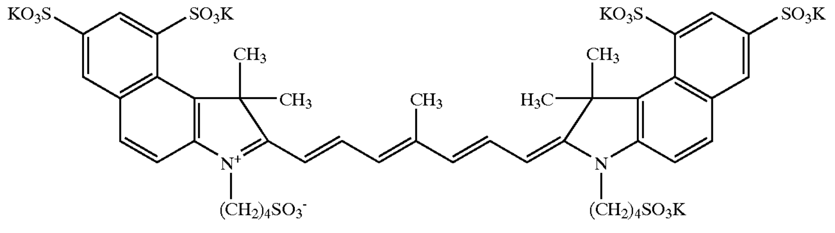

-continued
(IR-7)
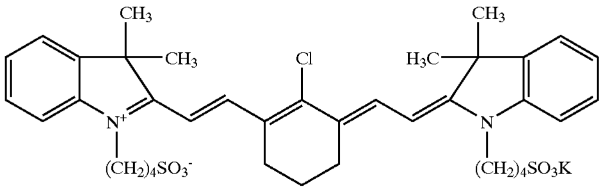
(IR-8)
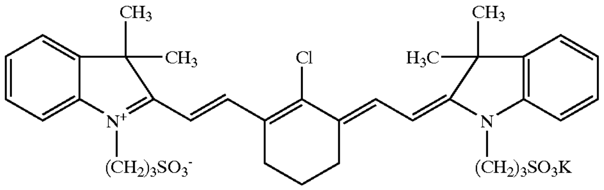
(IR-9)
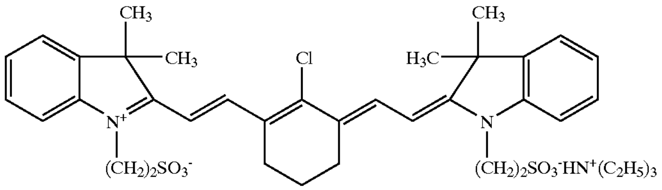
(IR-10)
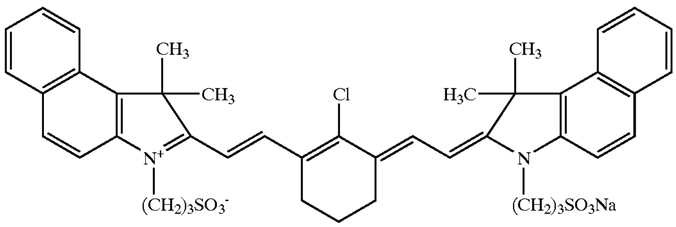
(IR-11)
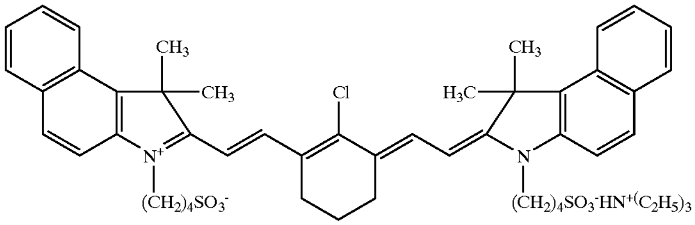
Although the dye to be used in the ink-receptive layer in the present invention may be any of the infrared-absorbing dyes, it is preferably a dye which is more oleophilic. Examples of the preferred dye include the following.
(IR-21)
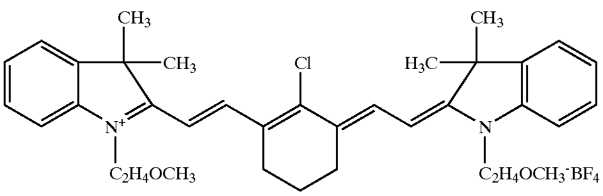
(IR-22)
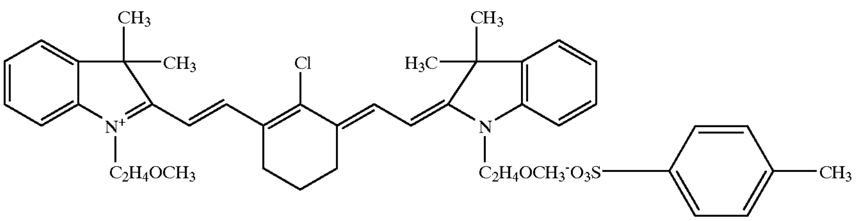

-continued
(IR-23)
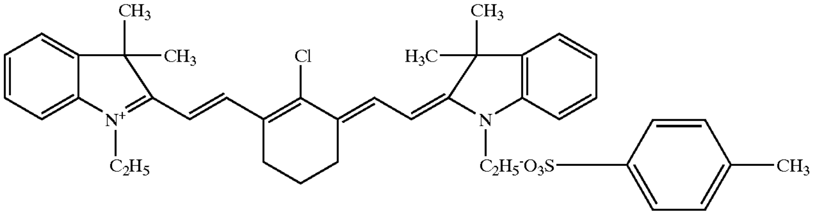
(IR-24)
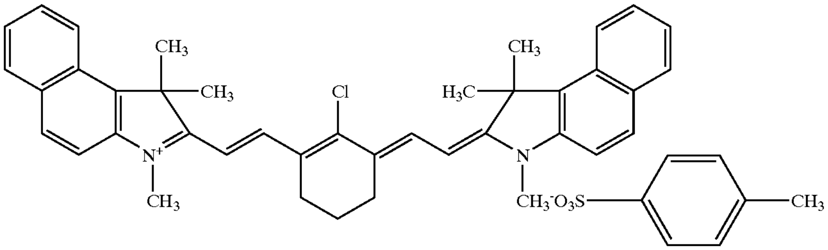
(IR-25)
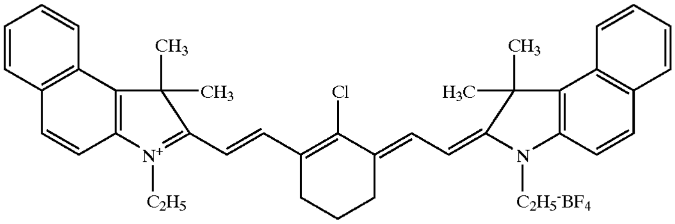
(IR-26)
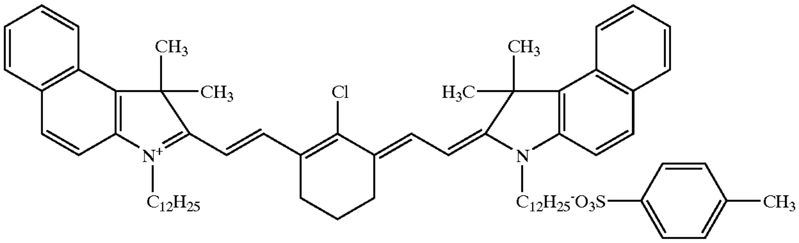
(IR-27)
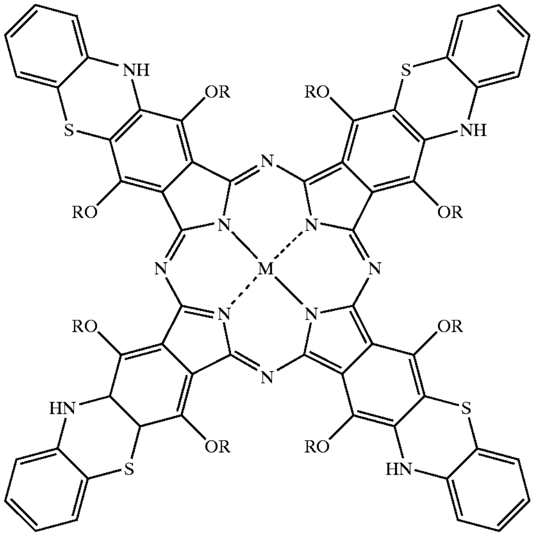
M = VO, R = i-$C_5H_{11}$ -continued (IR-28)

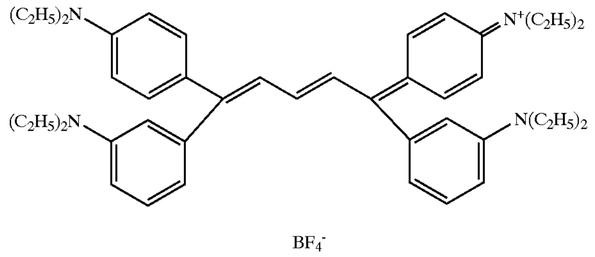

The amount of the light-to-heat converting agent to be added to the hydrophilic layer is preferably from 1 to 50% by weight based on the solid components of the hydrophilic layer, and that of the agent to be added to the overcoat layer is preferably from 2 to 50% by weight based on the solid components of the overcoat layer. With respect to the ink-receptive layer, the amount of the light-to-heat converting agent to be added thereto is preferably up to 20% by weight based on the solid components of the ink-receptive layer.

When at least one of the three layers contains a light-to-heat converting agent in an amount within that range, excellent sensitivity is obtained without impairing the film strength of each layer.

Examples of the high-power near-infrared or infrared laser to be used in the processes for lithographic printing plate production of the present invention include semiconductor lasers emitting infrared rays having a wavelength of from 700 to 1,200 nm and solid high-power infrared lasers such as YAG lasers.

The heat-sensitive lithographic printing plate precursor according to the present invention is imagewise exposed with a plate setter having the laser mounted thereon, and is then attached to a printing machine without undergoing any other treatment. Subsequently, a dampening water and an ink are supplied to the printing plate precursor to thereby remove the overcoat layer and the exposed parts of the hydrophilic layer. Paper is then fed to initiate printing. In the case of a printing machine equipped with a laser drawing apparatus, the printing plate precursor is attached to the printing machine and then exposed thereon. The subsequent procedure is the same as on ordinary printing machines.

Of those steps, the step of development on the printing machine (i.e., on-press development) is important. Namely, methods of supplying a dampening water and an ink for development are important for the processes for lithographic printing plate production of the present invention, which are intended to improve initial ink receptivity.

In a printing machine equipped with a dampening water feeder of the direct water-supplying type which supplies a dampening water to the plate surface with a dampening roll independent of an inking roll, e.g., a Komorimatic water-supplying apparatus, development is conducted in the following manner. The plate cylinder to which the printing plate precursor has been attached is rotated. Thereafter, the dampening roll and the inking roll are simultaneously brought into contact with the plate surface to supply an ink and a dampening water to the plate surface and thereby develop the printing plate precursor on the printing machine.

In a printing machine equipped with a dampening water feeder of the indirect water-supplying type in which a water-metering roll is brought into contact with a first inking roll and a dampening water is supplied to the plate surface through the first inking roll functioning also to dampen, e.g., a Dahlgren water-supplying system, development is conducted in the following manner. The plate cylinder is rotated. Thereafter, the water-metering roll is brought into contact with the inking roll. This inking roll is then brought into contact with the plate surface to supply an ink and a dampening water to the plate surface and thereby develop the printing plate precursor on the printing machine.

In a printing machine equipped with a dampening water feeder of the direct/indirect water-supplying type in which a first inking roll is connected to a dampening roll by a bridging roll and a dampening water is supplied to the plate surface partly through the inking roll, such as an Alcolor water-supplying apparatus, development is conducted in the following manner. As in the case of the printing machine equipped with a direct water-supplying type dampening water feeder, the dampening roll and the inking roll are simultaneously brought into contact with the plate surface to thereby develop the printing plate precursor on the printing machine.

The expression "the dampening roll and the inking roll are simultaneously brought into contact with the plate surface" used for the processes described above includes successive operations in which the dampening roll is brought into contact with the plate surface and, immediately thereafter, the inking roll is brought into contact with the plate surface.

EXAMPLES

The present invention will be explained below in more detail by reference to Examples, but the present invention should not be construed as being limited to these Examples.

Example 1

[Production of Heat-Sensitive Lithographic Printing Plate Precursor]

A surface of a 0.24 mm-thick rolled sheet of a JIS A 1050 aluminum material comprising 99.5 wt % aluminum, 0.01 wt % copper, 0.03 wt % titanium, 0.3 wt % iron, and 0.1 wt % silicon was subjected to graining with a 20 wt % aqueous suspension of a 400-mesh pumice powder (manufactured by Kyoritsu Ceramic Materials Co., Ltd.) and a rotating nylon brush (nylon-6,10). Thereafter, the sheet surface was sufficiently washed with water. This aluminum sheet was immersed in 15 wt % aqueous sodium hydroxide solution (containing 4.5 wt % aluminum) to etch the sheet so that the aluminum removed therefrom by dissolution amounted to 5 $g/m^2$. The aluminum sheet etched was washed with running water and then neutralized with 1 wt % aqueous nitric acid solution. Subsequently, an electrolytic surface-roughening treatment was performed in 0.7 wt % aqueous nitric acid solution (containing 0.5 wt % aluminum) using a rectangular wave alternating voltage, with an anode-time voltage of 10.5 V and a cathode-time voltage of 9.3 V (current ratio r=0.90; the current waveform described in Japanese Paten Publication No. 5796/1983). The anode-time quantity of electricity was 160 $C/dm^2$. This aluminum sheet was washed with water, subsequently immersed in 10 wt % aqueous sodium hydroxide solution at 35° C. to etch the sheet so that the aluminum removed therefrom by dissolution amounted to 1 $g/m^2$, and then washed with water. Subsequently, the aluminum sheet was immersed in 30 wt % aqueous sulfuric acid solution at 50° C. to be subjected to desmutting and then washed with water.

Furthermore, the aluminum sheet was subjected to a treatment for forming a porous anodization film with a direct current in 20 wt % aqueous sulfuric acid solution (containing 0.8 wt % aluminum) at 35° C. In this treatment, electrolysis was conducted at a current density of 13 $A/g/m^2$. By regulating the electrolysis period, an anodization film was formed in an amount of 2.7 $g/m^2$.

The substrate thus obtained was washed with water, immersed in 0.2 wt % aqueous sodium silicate solution at 70° C. for 30 seconds, washed with water, and then dried. Fluorescent X-ray analysis revealed that the amount of the silicate deposited was 5 $mg/m^2$ in terms of silicon amount.

The aluminum base thus obtained had a reflection density, as measured with Macbeth densitometer RD 920, of 0.30 and a center-line average surface roughness of 0.58 μm.

A coating fluid for ink-receptive layer formation which had the following composition was applied to the support with a bar K6 in an amount of 11.25 $mL/m^2$, and the coating was dried by heating at 100° C. for 1 minute. Thus, an ink-receptive layer was obtained in an amount of 0.45 $g/m^2$ on a dry basis.

| (Coating Fluid for Ink-receptive layer Formation) | |
|---|---|
| Epikote 1009 (manufactured by Yuka Shell Epoxy K.K.) | 0.8 g |
| Epikote 1001 (manufactured by Yuka Shell Epoxy K.K.) | 0.2 g |
| light-to-heat converting agent (IR-24 shown hereinabove) | 0.2 g |
| Methyl ethyl ketone | 2 g |
| Propylene glycol monomethyl ether | 23 g |

A coating fluid for hydrophilic-layer formation having the following composition was applied to the thus-formed ink-receptive layer with a bar K6, and the coating was dried at 100° C. for 1 minute to form a hydrophilic layer in an amount of 0.39 $g/m^2$ on a dry basis.

| (Coating Fluid for Hydrophilic-Layer Formation) | |
|---|---|
| Methanol silica (manufactured by Nissan Chemical Industries, Ltd.; 30 wt % colloidal methanol solution of silica; silica particle diameter, 10–20 nm) | 3 g |
| 5 wt % Methanol solution of poly(acrylic acid) (weight-average molecular weight, 250,000) | 2 g |
| Methyl lactate | 1 g |
| Methanol | 17.53 g |

A coating fluid for overcoat layer formation having the following composition was applied to the hydrophilic layer with a bar K6, and the coating was dried at 100° C. for 90 seconds to form an overcoat layer in an amount of 0.22 $g/m^2$ on a dry basis. Thus, a heat-sensitive lithographic printing plate precursor was produced.

| (Coating Fluid for Overcoat Layer Formation) | |
|---|---|
| 28 wt % aqueous solution of gum arabic | 1.5 g |
| Light-to-heat converting agent (IR-10 shown hereinabove) | 0.042 g |
| Polyoxyethylene nonylphenyl ether (10 wt % aqueous solution) | 0.168 g |
| Ion-exchanged water | 22 g |

[Production of Lithographic Printing Plate and Evaluation in Printing]

The heat-sensitive lithographic printing plate precursor was attached to printing machine Speed Master 74DI (four-color printing press equipped with a writing apparatus including a 40-W semiconductor laser emitting 830-nm light and an Alcolor water-supplying apparatus), manufactured by Heidelberg. The printing plate precursor was imagewise exposed under the conditions of a laser output of 16 W, plate surface energy of 230 $mJ/cm^2$, and plate cylinder rotational speed of 12,000 revolutions per hour. After completion of the exposure, the dampening roll and the inking rolls were simultaneously brought into contact with the plate surface and the plate cylinder was caused to make 20 revolutions. Thereafter, the impression cylinder was switched on and, simultaneously therewith, coat paper began to be fed. After ten to twelve sheets were printed, a four-color printed matter bearing a complete ink image was obtained.

The inks used here were GEOS-G Sumi, Beni, Ki, and Ai, manufactured by Dainippon Ink & Chemical, Inc. and the dampening water used was an aqueous solution of IF101 (3%)/IF202 (0.75%), manufactured by Fuji Photo Film Co., Ltd.

Printing was continued while operating the printing machine at a rotational speed of 8,000 revolutions per hour. Thus, 20,000 satisfactory printed matters free from staining were obtained before completion of the printing.

Example 2

The heat-sensitive lithographic printing plate precursor obtained in Example 1 was exposed with Trend Setter 3244 (plate setter equipped with a 40-W semiconductor laser emitting 830-nm light), manufactured by Kureo, under the conditions of a rotational speed of 150 revolutions per hour, laser output of 12.8 W, and plate surface energy of 200 $mJ/cm^2$. The printing plate precursor exposed was attached to printing machine Lithlon 26 (two-color press equipped with a Komorimatic water-supplying apparatus), manufactured by Komori Corporation, without undergoing any other treatment. Subsequently, the dampening roll and the inking rolls were simultaneously brought into contact with the plate surface and the plate cylinder was caused to make 20 revolutions. Thereafter, the impression cylinder was switched on and, simultaneously therewith, coat paper began to be fed. After ten sheets were printed, a two-color printed matter bearing a complete ink image was obtained.

The inks used here were GEOS-G Sumi and Beni, manufactured by Dainippon Ink & Chemicals, Inc. and the dampening water used was a 4% aqueous solution of IF102, manufactured by Fuji Photo Film Co., Ltd.

Printing was continued while operating the printing machine at a rotational speed of 8,000 revolutions per hour. Thus, 20,000 satisfactory printed matters free from staining were obtained before completion of the printing.

Comparative Examples 1 and 2

The same procedures as in Examples 1 and 2 were conducted, except that in place of employing the technique in which the dampening roll and the inking rolls were simultaneously brought into contact with the plate surface, use was made of the following method for development on the printing machine. The dampening roll only was first brought into contact with the plate surface and the plate cylinder was caused to make 20 revolutions. Thereafter, the inking rolls were brought into contact with the plate surface and the impression cylinder was subsequently switched on.

As a result, the printing plate prepared by this method had poor ink receptivity on each of the printing machines, and necessitated from 200- to 1,000-sheet printing before complete ink reception.

Example 3

Production of a lithographic printing plate and printing were conducted using single-color printing machine Harris Aurelia H-125 equipped with a Dahlgren water-supplying apparatus, in place of the printing machine used in Example 2. The printing plate precursor which had been exposed was attached to the plate cylinder and the plate cylinder was rotated. Thereafter, the water-metering roll was brought into contact with the inking roll, and this inking roll, which functioned also to dampen, was brought into contact with the plate surface. The plate cylinder was caused to make 20 revolutions. Subsequently, the impression cylinder was switched on and, simultaneously therewith, coat paper began to be fed. After ten sheets were printed, a printed matter bearing a complete ink image was obtained.

The ink used here was GEOS-G Sumi, manufactured by Dainippon Ink & Chemicals, Inc. and the dampening water used was an aqueous solution of EU-3 (1%), manufactured by Fuji Photo Film Co., Ltd., and isopropyl alcohol (10%).

Printing was continued while operating the printing machine at a rotational speed of 8,000 revolutions per hour. Thus, 20,000 satisfactory printed matters free from staining were obtained before completion of the printing.

Example 4

Exposure, production of a printing plate, and printing were conducted in the same manner as in Example 1, except that the inks used in Example 1 were replaced with Hiecho Sumi, Beni, Ki, and Ai, manufactured by Toyo Ink Mfg. Co., Ltd. As a result, a satisfactory color printed matter free from staining was obtained after ten to twelve sheets were printed for ink reception, as in Example 1.

Examples 5 and 6

Exposure, development on a printing machine, and printing were conducted in the same manner as in Example 2, except that in place of the dampening water used in Example 2, use was made of an aqueous solution of Astromark III (3%), manufactured by Nikken Kagaku Kenkyu-jo K.K., and isopropyl alcohol (3%) in Example 5 and an aqueous solution of JRZ Emerald 2964 (4 ounces/gallon) and ARS-ML2013 (3 ounces/gallon), manufactured by Anchor, in Example 6. As a result, in each of Examples 5 and 6, a satisfactory printed matter free from staining was obtained after ten sheets were printed for ink reception.

Effect of the Invention

According to the present invention, satisfactory initial ink receptivity is obtained in printing employing an ablation type heat-sensitive lithographic printing plate precursor.

The entitle disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A process for producing a lithographic printing plate which comprises: imagewise exposing with a high-power near-infrared or infrared laser a heat-sensitive lithographic printing plate precursor which comprises a metallic base having thereon, in this order, (1) an ink-receptive layer, (2) a hydrophilic layer containing colloidal particles of an oxide or hydroxide of at least one element selected from the group consisting of beryllium, magnesium, aluminum, silicon, titanium, boron, germanium, tin, zirconium, iron, vanadium, antimony, and the transition metals, and (3) a hydrophilic overcoat layer capable of being removed on a printing machine and which contains a compound capable of converting light into heat in at least one of the ink-receptive layer, the hydrophilic layer, and the hydrophilic overcoat layer; attaching the printing plate precursor to the plate cylinder of a printing machine without subjecting the plate precursor to any treatment; rotating the plate cylinder; subsequently supplying an ink and a dampening water to the plate surface by simultaneously bringing a dampening roll and an inking roll into contact with the plate surface or by bringing a water-metering roll into contact with an inking roll and then bringing the inking roll, which functions also to dampen, into contact with the plate surface; and thereby removing the overcoat layer and those parts of the hydrophilic layer which have been exposed.

2. A process for producing a lithographic printing plate on a printing machine which comprises: attaching the heat-sensitive lithographic printing plate precursor described in claim 1 to the plate cylinder of a printing machine equipped with a laser-exposing apparatus; imagewise exposing the printing plate precursor with a near-infrared or infrared laser from the laser-exposing apparatus mounted on the printing machine, while rotating the plate cylinder; subsequently supplying an ink and a dampening water to the plate surface after completion of the imagewise exposure, without stopping the rotation of the plate cylinder, by simultaneously bringing a dampening roll and an inking roll into contact with the plate surface or by bringing a water-metering roll into contact with an inking roll and then bringing the inking roll, which functions also to dampen, into contact with the plate surface; and thereby removing the overcoat layer and those parts of the hydrophilic layer which have been exposed.

* * * * *